(12) United States Patent
Mimura et al.

(10) Patent No.: US 7,391,114 B2
(45) Date of Patent: Jun. 24, 2008

(54) ELECTRODE PAD SECTION FOR EXTERNAL CONNECTION

(75) Inventors: Tadaaki Mimura, Katano (JP); Tsuyoshi Hamatani, Otsu (JP); Atuhito Mizutani, Uji (JP); Kenji Ueda, Yamatokooriyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/046,697

(22) Filed: Feb. 1, 2005

(65) Prior Publication Data
US 2005/0173801 A1    Aug. 11, 2005

(30) Foreign Application Priority Data
Feb. 5, 2004   (JP)   ............... 2004-029095
Dec. 9, 2004   (JP)   ............... 2004-356108

(51) Int. Cl.
*H01L 23/48* (2006.01)
*H01L 23/52* (2006.01)
*H01L 29/40* (2006.01)
*H01L 27/10* (2006.01)
*H01L 29/73* (2006.01)

(52) U.S. Cl. ............ 257/758; 257/207; 257/208; 257/211; 257/700; 257/759; 257/760; 257/774; 257/776; 257/780; 257/781; 257/784; 257/786

(58) Field of Classification Search ........ 257/758–760, 257/774, 776, 207–208, 211, 700, 780–781, 257/784, 786
See application file for complete search history.

(56) References Cited

U.S. PATENT DOCUMENTS

| | | | | |
|---|---|---|---|---|
| 5,736,791 A | * | 4/1998 | Fujiki et al. ............ | 257/781 |
| 5,739,587 A | * | 4/1998 | Sato ...................... | 257/758 |
| 5,989,991 A | * | 11/1999 | Lien ...................... | 438/612 |
| 6,100,589 A | * | 8/2000 | Tanaka ................... | 257/758 |
| 6,184,143 B1 | * | 2/2001 | Ohashi et al. ............. | 438/691 |
| 6,291,331 B1 | * | 9/2001 | Wang et al. .............. | 438/618 |
| 6,300,688 B1 | * | 10/2001 | Wong ..................... | 257/786 |
| 6,306,749 B1 | * | 10/2001 | Lin ....................... | 438/612 |
| 6,455,943 B1 | * | 9/2002 | Sheu et al. ................ | 257/786 |
| 6,522,021 B2 | * | 2/2003 | Sakihama et al. .......... | 257/784 |
| 6,524,905 B2 | * | 2/2003 | Yamamichi et al. ........ | 438/240 |
| 6,717,238 B2 | * | 4/2004 | Ker et al. ................ | 257/602 |

(Continued)

FOREIGN PATENT DOCUMENTS

JP    59-222952    12/1984

(Continued)

*Primary Examiner*—Ida M. Soward
(74) *Attorney, Agent, or Firm*—Steptoe & Johnson LLP (57) ABSTRACT

A pad section serving as an electrode for external connection of a semiconductor device includes a first pad metal (61) formed in the top layer, a second pad metal (62) formed under the first pad metal (61) via an interlayer insulating film (71), and vias (63) which penetrate the interlayer insulating film (71) and electrically connect the first pad metal (61) and the second pad metal (62). The first pad metal (61) and the second pad metal (62) have edges displaced from each other so as not to be aligned with each other along the thickness direction of each layer. Thus, it is possible to reduce stress occurring on an edge of the second pad metal (62), thereby reducing damage on the interlayer insulating film (71) and so on.

10 Claims, 12 Drawing Sheets

U.S. PATENT DOCUMENTS

| | | | | |
|---|---|---|---|---|
| 6,717,270 | B1* | 4/2004 | Downey et al. | 257/758 |
| 6,727,590 | B2* | 4/2004 | Izumitani et al. | 257/758 |
| 6,774,484 | B2* | 8/2004 | Mimino et al. | 257/728 |
| 6,822,329 | B2* | 11/2004 | Varrot et al. | 257/758 |
| 6,844,631 | B2* | 1/2005 | Yong et al. | 257/786 |
| 2001/0000928 | A1* | 5/2001 | Lee et al. | 257/786 |
| 2001/0005046 | A1* | 6/2001 | Hsuan et al. | 257/686 |
| 2001/0016410 | A1* | 8/2001 | Cheng et al. | 438/622 |
| 2002/0100949 | A1* | 8/2002 | Kim | 257/459 |
| 2003/0218254 | A1* | 11/2003 | Kurimoto et al. | 257/758 |
| 2003/0218259 | A1* | 11/2003 | Chesire et al. | 257/786 |
| 2003/0230809 | A1* | 12/2003 | Nakajima et al. | 257/758 |
| 2004/0036174 | A1* | 2/2004 | Downey et al. | 257/758 |
| 2004/0145045 | A1* | 7/2004 | Huang et al. | 257/700 |
| 2005/0082577 | A1* | 4/2005 | Usui | 257/211 |

FOREIGN PATENT DOCUMENTS

| | | |
|---|---|---|
| JP | 06-204283 | 7/1994 |
| JP | 6-244235 | 9/1994 |
| JP | 08-293523 | 11/1996 |
| JP | 2000-198566 | 7/2000 |
| JP | 2001-267323 | 9/2001 |
| JP | 2001-284394 | 10/2001 |
| JP | 2002-016069 | 1/2002 |
| JP | 2002-134509 | 5/2002 |

* cited by examiner

ELECTRODE PAD SECTION FOR EXTERNAL CONNECTION

FIELD OF THE INVENTION

The present invention relates to an electrode for external connection of a semiconductor device and particularly relates to the structure and arrangement of a pad section.

BACKGROUND OF THE INVENTION

Figure 11A:
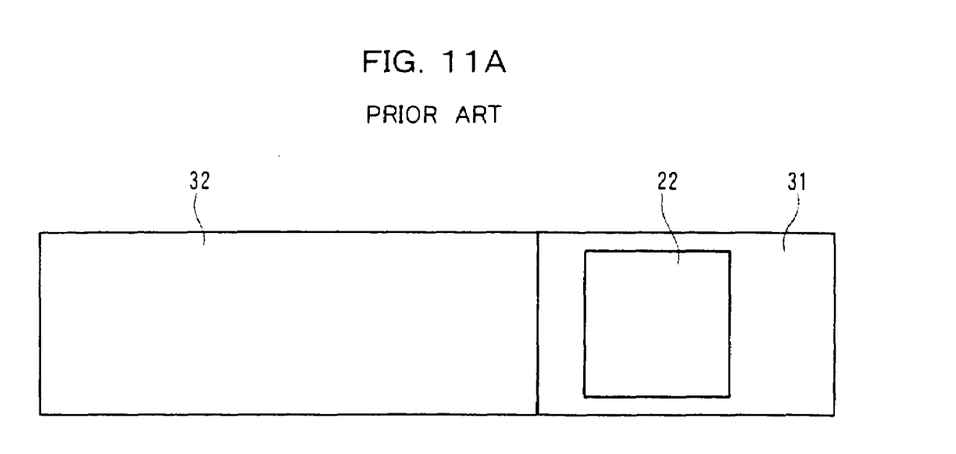
FIGS. 11A and 11B are a plan view and a sectional view showing a configuration of a pad section of a conventional semiconductor device and a part surrounding the pad section.
Figure 11B:
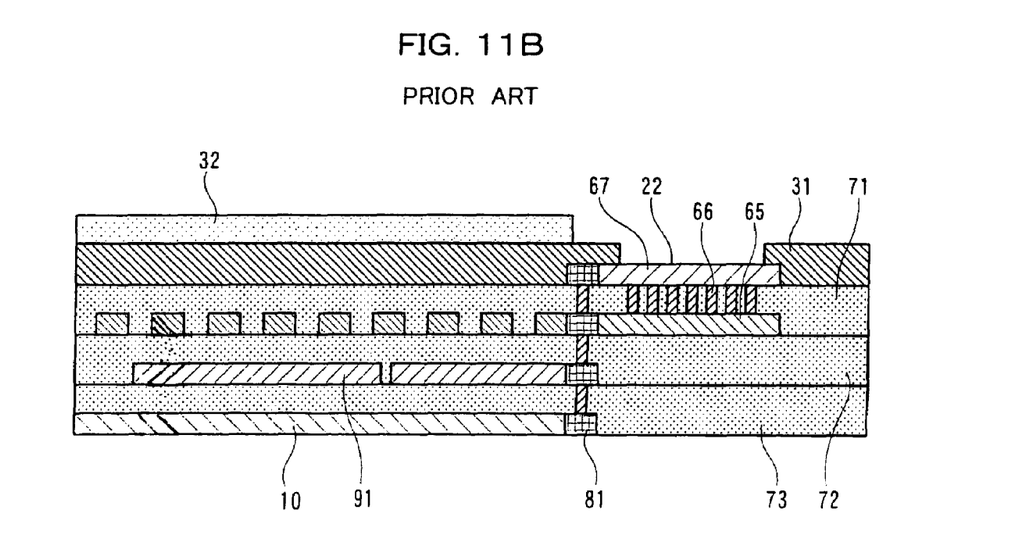

For example, as shown in FIG. 11, a conventional semiconductor device has a stacked via structure, whereby an electrode pad 22 serving as an electrode for external connection has a first pad metal 67 formed in the top layer and a second pad metal 65 formed in a wiring layer immediately under the first pad metal 67. The first pad metal 67 and the second pad metal 65 are electrically connected to each other through vias 66. The stacked via structure is connected to wiring 10 and so on via a stacked structure of a drawing metal 81. The wiring 10 is formed in an area other than an area immediately below the electrode pad 22 and is connected to a circuit element on a semiconductor substrate.

Another structure is proposed in which a pad for external connection is disposed on an element formation area of an input/output circuit cell to reduce a chip size. For example, a semiconductor integrated circuit is proposed in which an interlayer insulating film is disposed on a logic circuit and a driver circuit and an input or output pad is formed thereon (See Japanese Patent Laid-Open No. 06-244235).

However, when an electrode pad is formed on an element, the wiring and the interlayer insulating film immediately under the pad may be damaged by an impact load during wire bonding and so on. Alternatively, a diffusing element formed immediately under the pad, e.g., a transistor may change (degrade) its performance characteristics.

Particularly in wire bonding using a gold ball bond, a semiconductor chip is heated to 230 to 240° C. and an ultrasonic wave is applied while a predetermined load is applied, so that an oxide film on a surface of an aluminum pad is broken and a gold-aluminum alloy is formed on the intrinsic surface of aluminum and the interface of gold. Thus, a crack appears on the interlayer insulating film (made of $SiO_2$ or the like) due to stress caused by ultrasonic energy on the interface between metal and the interlayer insulating film under the pad.

Also in a wafer test by the cantilever method which is an ordinary method for a wafer test, an electrode pad is pressed by a probe needle made of tungsten or the like. Thus, a highly concentrated load is applied immediately below the electrode pad and a crack appears on the interlayer insulating film. Further, the electrode pad has a needle mark (indentation) of the probe needle. In the indentation, aluminum on a surface of the pad is scraped off by the probe needle and thus an alloy of a gold ball is not formed during wire bonding on the electrode pad after the wafer test. In recent years, a smaller bonding pitch is demanded for wire bonding and a pad size and a ball diameter have decreased. Thus, an area of an indentation has increased relatively, and the formation of an alloy or bonding cannot be performed in a predetermined area.

Figure 12:
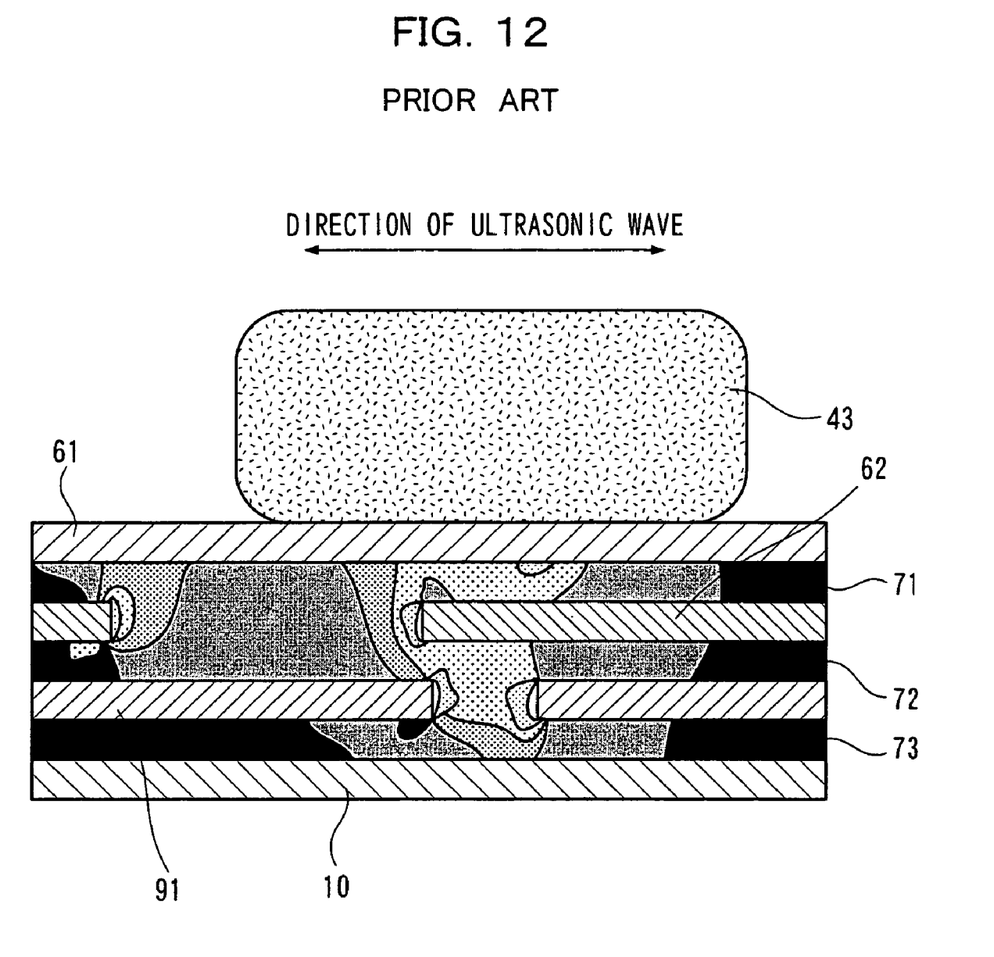
FIG. 12 is a distribution diagram of stress occurring on an interlayer insulating film of an electrode pad in a stacked structure.

FIG. 12 is a distribution chart showing stress occurring on the interlayer insulating film when ball bonding is performed on the electrode pad under which wiring section is disposed. FIG. 12 shows a result of calculating a stress distribution according to CAE analysis (finite element method) when a metal bump is formed on a four-layered wiring structure by gold ball bonding.

Under a pad metal 61 (hereinafter, referred to as a first metal 61) in the top layer, a first interlayer insulating film 71 and a pad metal 62 (hereinafter, referred to as a second metal 62) in the second layer are formed. Under the second metal 62, a second interlayer insulating film 72, a third metal 91, a third interlayer insulating film 73, and a bottom layer metal 10 are formed. When an ultrasonic wave is applied along an arrow of FIG. 12 to form a metal bump 43 on the first metal 61, stress is concentrated on edges of the lower metals 62 and 91 (illustrated as whitish portions in FIG. 12).

When the stress exceeds the yield stresses of the interlayer insulating films 71, 72, and 73, a brittle fracture occurs and a crack appears. The CAE analysis proves that internal stress also increases according to the magnitude of applied ultrasonic energy. Moreover, it is found that a transistor formed immediately below the bonded electrode pad degrades its characteristics (Vt, Gm, hot carrier life time, etc.).

The present invention is devised to solve these problems. It is an object of the present invention to reduce damage on a surface of an electrode pad, a lower wiring, and an interlayer insulating film during bonding and probing.

DISCLOSURE OF THE INVENTION

In order to solve the problems, a semiconductor device of the present invention, comprising a pad section serving as an electrode for external connection, wherein the pad section includes a first pad metal layer formed in the top layer, a second pad metal layer formed under the first pad metal layer via an interlayer insulating film, and vias which penetrate the interlayer insulating film and electrically connect the first pad metal layer and the second pad metal layer, and the first pad metal layer and the second pad metal layer have edges displaced from each other so as not to be aligned with each other along the thickness direction of each layer.

Further, a semiconductor device of the present invention, comprising a pad section serving as an electrode for external connection, wherein the pad section includes a first pad area for bonding and a second pad area for a wafer test, the first pad area includes a first pad metal layer formed in the top layer, a second pad metal layer formed under the first pad metal layer via an interlayer insulating film, and vias which penetrate the interlayer insulating film and electrically connect the first pad metal layer and the second pad metal layer, the first pad metal layer and the second pad metal layer have edges displaced from each other so as not to be aligned with each other along the thickness direction of each layer, and the second pad area consists only of the first pad metal layer.

It is preferable that the edge of the first pad metal layer and the edge of the second pad metal layer are displaced from each other by 1.5 to 2 μm.

The edge of the second pad metal layer may be displaced outside the edge of the first pad metal layer. The edge of the second pad metal layer may be displaced inside the edge of the first pad metal layer.

It is preferable that a plurality of dummy metals are disposed under the first pad metal layer of the second pad area via the interlayer insulating film so as to form the same layer as the second pad metal layer.

A circuit element or wiring may be disposed under the pad section.

A circuit element or wiring may be disposed at least under the first pad area or the second pad area.

DESCRIPTION OF THE EMBODIMENTS

The following will describe embodiments of the present invention in accordance with the accompanying drawings.

A semiconductor device of the present invention includes both of a wafer-like semiconductor integrated circuit device and individual semiconductor devices. The semiconductor integrated circuit device will be discussed below.

Figure 1A:
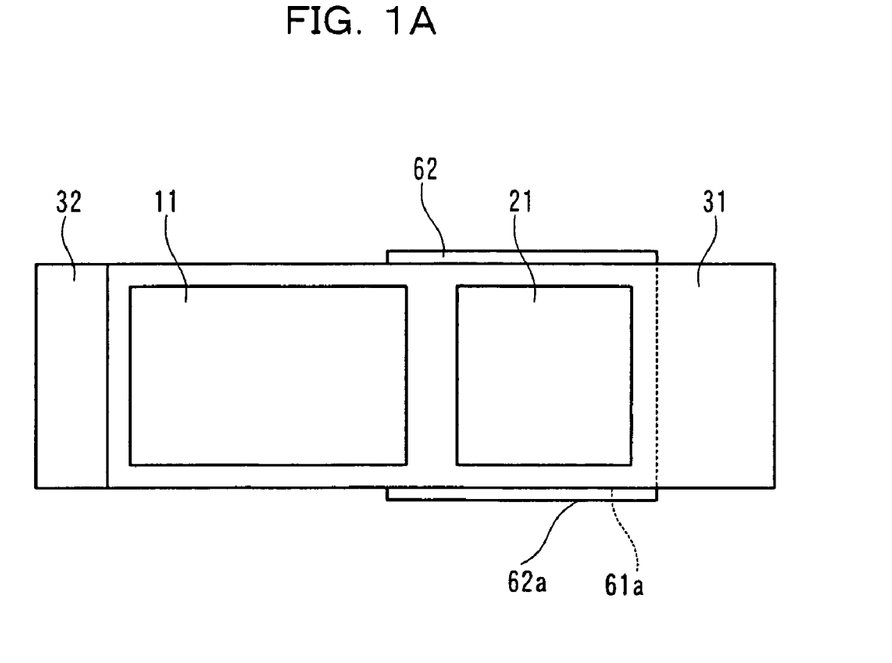
FIGS. 1A and 1B are a plan view and a sectional view showing a configuration of a pad section of a semiconductor device and a part surrounding the pad section according to Embodiment 1 of the present invention.
Figure 1B:
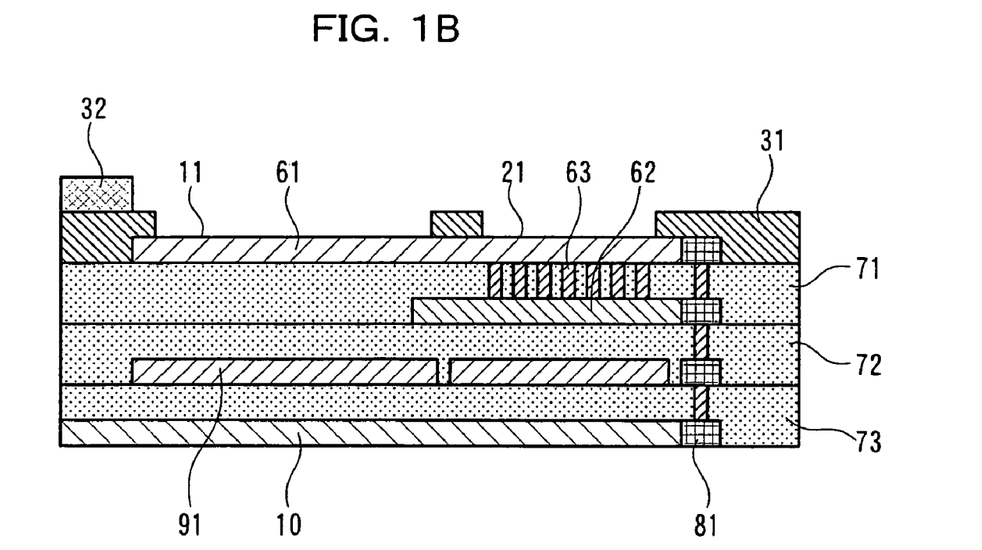

FIG. 1 shows the main configuration of the semiconductor device according to Embodiment 1 of the present invention. FIGS. 1A and 1B are a plan view and a sectional view showing a pad section, which is an electrode for external connection of the semiconductor device, and a part around the pad section. FIG. 1 shows that the pad section is formed on an element area or wiring of an input/output circuit and has a four-layered wiring structure.

In FIG. 1, reference numeral 11 denotes a probe pad for inspecting a wafer by probing, reference numeral 21 denotes a bonding pad used for assembling a wire bond and so on, reference numeral 31 denotes a first protective film (e.g., a P-doped P—SiN film) which is formed on a semiconductor substrate other than the top surfaces of the probe pad 11 and the bonding pad 21, and reference numeral 32 denotes a second protective film (e.g., a polyimide film) which is formed on the first protective film 31.

The bonding pad 21 has a stacked via structure which is constituted of a pad metal 61 (hereinafter, referred to as a first metal 61) in the top layer, a pad metal 62 (hereinafter, referred to as a second metal 62) in the second layer formed immediately below the metal 61, and vias 63 (e.g., a metal such as W (tungsten)) which penetrate an interlayer insulating film 71 between the first metal 61 and the second metal 62 and electrically connect the metals 61 and 62. The stacked via structure has the effect of absorbing impact energy occurring in a bonding process such as wire bonding, reducing stress applied to a wiring section or a diffusing element immediately under a pad, and reducing the occurrence of damage.

Under the second metal 62 of the bonding pad 21, third metals 91 are provided which are, e.g., power supply layers for supplying power. A bottom layer metal 10, which is wiring for supplying signals to the input/output circuit, is formed under the third metals 91. The first and second metals 61 and 62 and the bottom layer metal 10 are electrically connected to one another via the stacked structure of a drawing metal 81. Interlayer insulating films 72 and 73 are formed respectively between the second metal 62 and the third metals 91 and between the third metals 91 and the bottom layer metal 10.

The bonding pad 21 and the probe pad 11 are formed integrally with the first metal 61 and are exposed respectively from two contact windows which are separately formed on the first protective film 31 on the first metal 61. In reality, the probe pad 11 and the bonding pad 21 may be simply separated as areas and the separation by the first protective film 31 is not always necessary.

Unlike the bonding pad 21, the probe pad 11 does not have the stacked via structure constituted of the two layers of the metals 61 and 62 but is constituted only of the first metal 61. The third metals 91 are provided under the first metal 61 via the interlayer insulating films 71 and 72. Under the third metals 91, the interlayer insulating film 73 and the bottom layer metal 10 are formed in the same manner as the bonding pad 21.

The second metal 62 is larger than the bonding pad 21 in the vertical and horizontal directions. The two third metals 91, which are provided under the bonding pad 21 and the probe pad 11, respectively, are adjacent to each other between the center and an edge of the second metal 62.

Figure 2A:
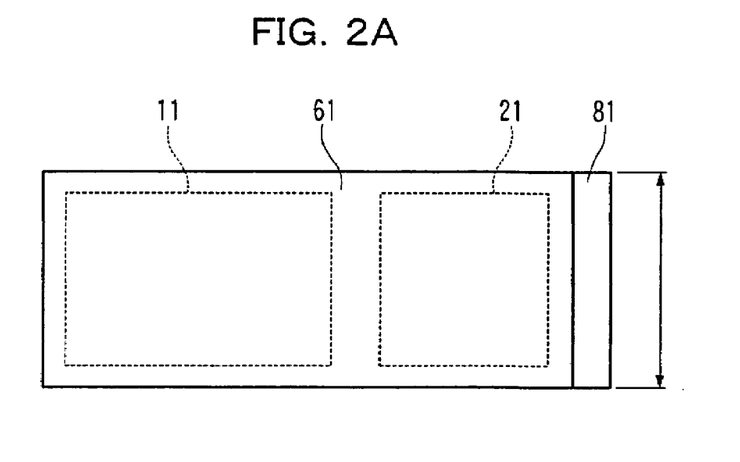
FIG. 2 is a plan view showing each layer of the pad section shown in FIG. 1.
Figure 2B:
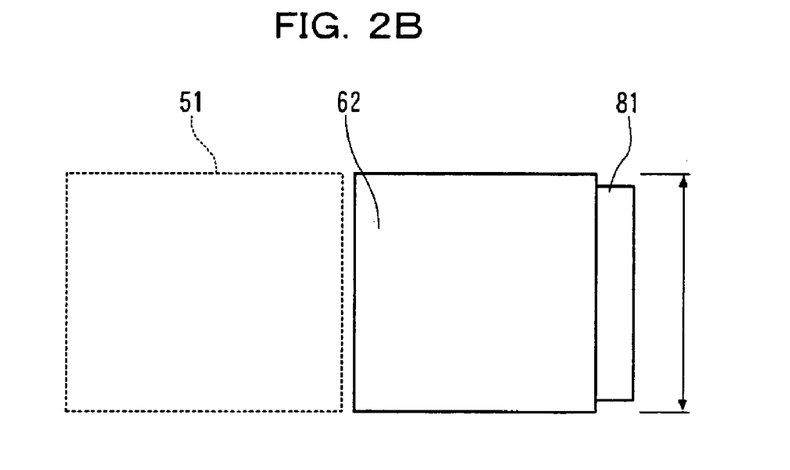
Figure 2C:
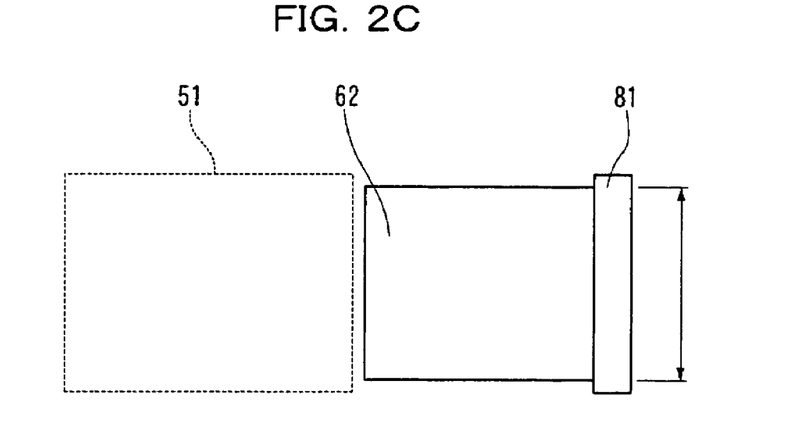

FIG. 2 is a plan view showing each layer of the probe pad 11 and the bonding pad 21. FIG. 2A shows the layer of the first metal 61 and FIGS. 2B and 2C show two examples of the layer of the second metal 62.

FIG. 2A shows the area of the probe pad 11 and the area of the bonding pad 21 on the first metal 61. The probe pad 11 and the bonding pad 21 are separated by the first protective film 31. The drawing metal 81 has the same width as the pad metal 61.

In FIG. 2B, as is understood from the width of the drawing metal 81, the second metal 62 is larger in width than the first metal 61.

In FIG. 2C, as is understood from the width of the drawing metal 81, the second metal 62 is smaller in width than the first metal 61.

In both of the structures shown in FIGS. 2B and 2C, an edge 61a of the first metal 61 and an edge 62a of the second metal 62 are displaced from each other such that the edges are not aligned with each other along the thickness direction of each layer, that is, the edges are not aligned or slightly overlapped vertically in plan view. In this case, a pair of edges of the second metal 62 protrude or retract from the first metal 61. The configuration is not limited to the above and any one of the metals may protrude or retract as long as the edges are displaced from each other along the vertical direction of the interlayer insulating film. As is evident from FIG. 1, the other pair of edges 62a of the second metal 62 are in contact with the drawing metal 81 or displaced from the edges 61a of the first metal 61. Reference numeral 51 denotes an interlayer insulating film in an area under the probe pad 11. The interlayer insulating film is a part of the interlayer insulating film 71. No metal is formed in this area.

Figure 3A:
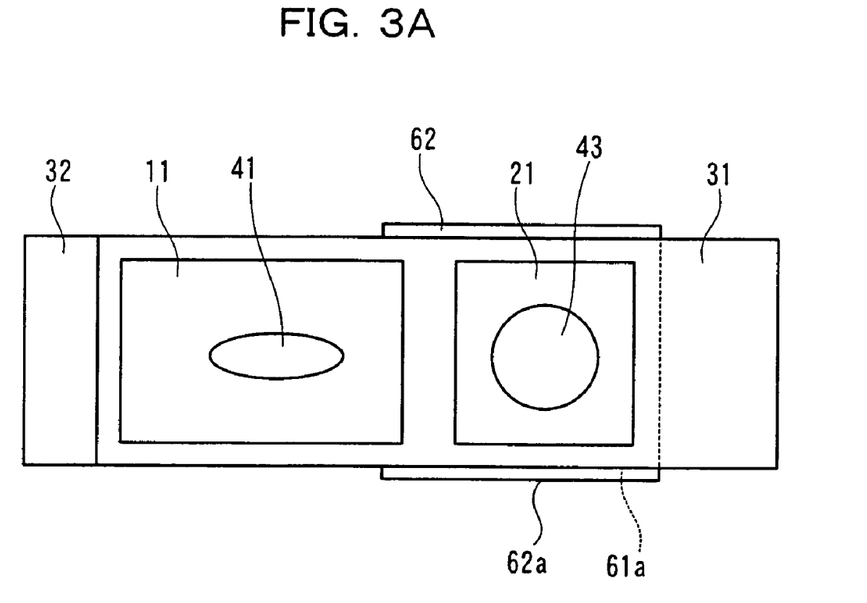
FIGS. 3A and 3B are a plan view and a sectional view showing a state of probing and ball bonding on the pad section shown in FIG. 1.
Figure 3B:
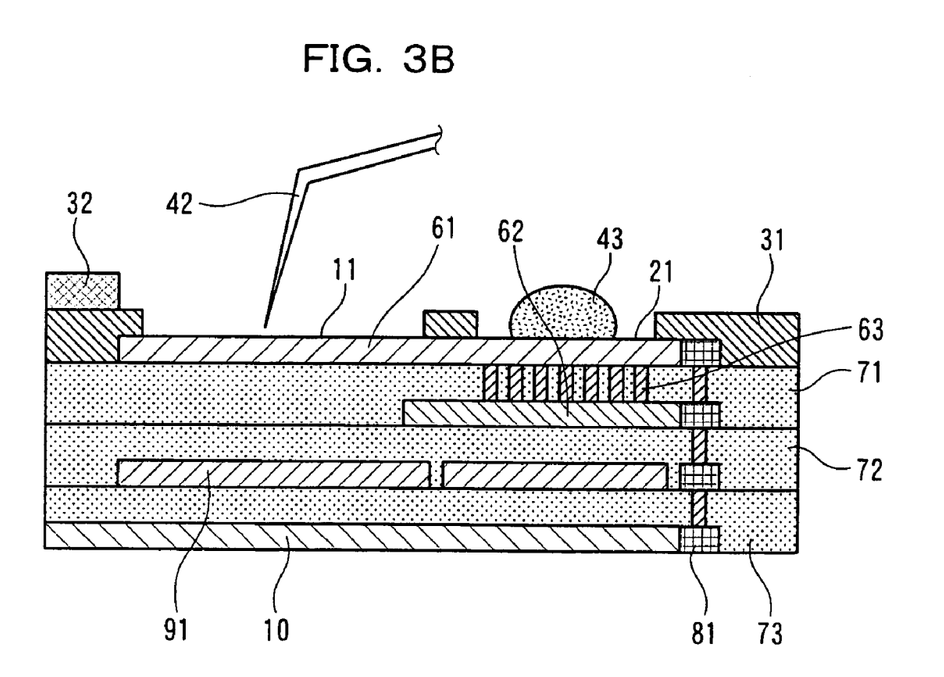

FIG. 3 shows a state around the pad during probing and ball bonding. FIGS. 3A and 3B are a plan view and a sectional view, respectively. A probe mark 41 appears on the probe pad 11 due to the sliding of a probe needle 42. A metal bump 43 is formed on the bonding pad 21 in the same manner as wire bonding.

Even when a load is applied on the pad during probing and ball bonding, the edge 61a of the first metal 61 and the edge 62a of the second metal 62 are displaced from each other in the above manner and thus it is possible to reduce stress concentration occurring on the edges 61a and 62a, thereby reducing the occurrence of physical damage such as cracks on the interlayer insulating films 71 and 72. Also in the area under the probe pad 11, the interlayer insulating films 71 and 72 can be increased in total thickness because no metal is formed. Thus, it is possible to reduce the occurrence of cracks. Consequently it is possible to prevent an electrical short circuit/leakage between the first metal 61 and the third metals 91. The same holds true for the third metals 91, the bottom layer metal 10, and the interlayer insulating films 72 and 73 under the second metal 62.

When a wire has an initial ball diameter of 45 µm during wire bonding and an ultrasonic power is constant during wire bonding, the incidence of cracks is 3.2% in the conventional structure where the edges of the first metal 61 and the second metal 62 are aligned with each other, whereas the incidence of cracks decreases in the structure of the present invention where the edges of the first metal 61 and the second metal 62 are displaced from each other as shown in FIGS. 2B and 2C. When the displacement is 1.5 to 2 µm, the incidence of cracks is 0%. A displacement larger than the above does not change the effect. When the displacement is too large, a distance between the pads increases, resulting in a lower density of pads.

Embodiment 1 described the electrode for external connection that comprises both of the probe pad 11 and the bonding pad 21. Regarding an electrode for external connection that comprises at least the bonding pad 21, the above structure can reduce the occurrence of cracks on interlayer insulating films when a load is applied.

Figure 4A:
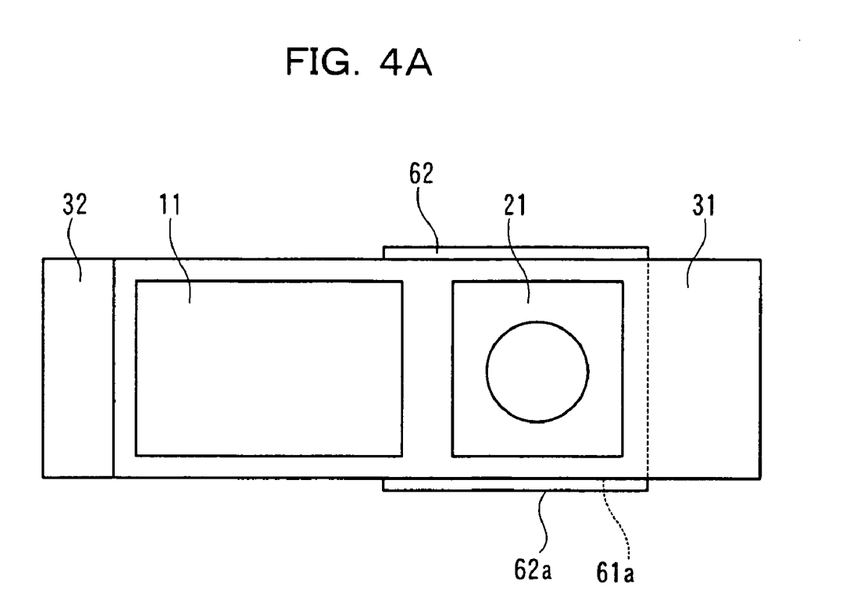
FIGS. 4A and 4B are a plan view and a sectional view showing the configuration of a pad section of a semiconductor device and a part surrounding the pad section according to Embodiment 2 of the present invention.
Figure 4B:
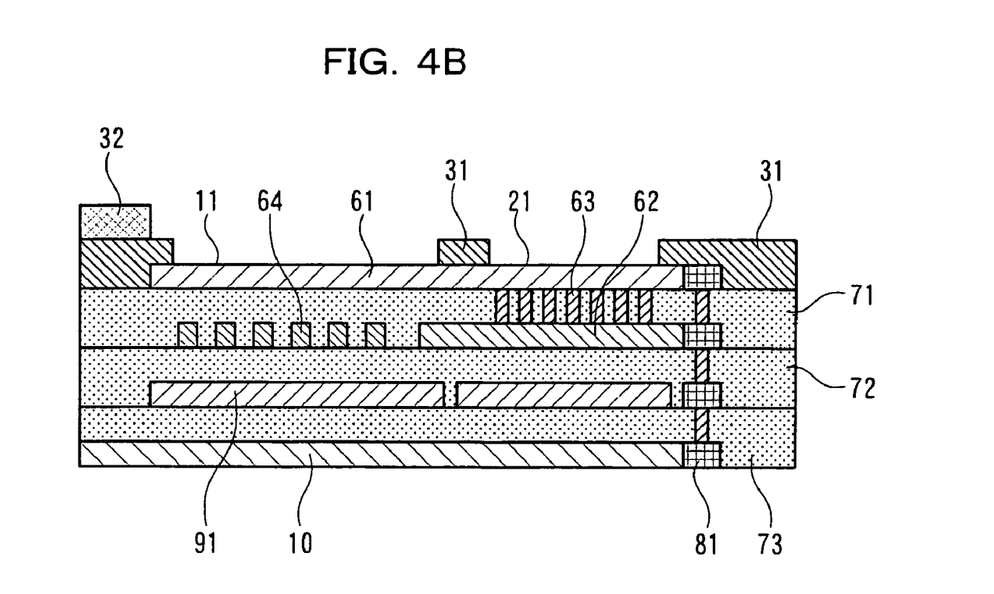

FIG. 4 shows the main configuration of a semiconductor device according to Embodiment 2 of the present invention. FIGS. 4A and 4B are a plan view and a sectional view showing a pad section, which is an electrode for external connection of the semiconductor device, and a part around the pad section.

The semiconductor device of Embodiment 2 is different from that of Embodiment 1 in that small buffer metals 64 of several square micrometers are arranged in a lattice form, that is, arranged vertically and horizontally in a plurality of lines under a probe pad 11 so as to form the same layer as a second metal 62 of a bonding pad 21. The presence of the small buffer metals 64 can reduce stress concentration which occurs in an interlayer insulating film 71 under the probe pad 11 due to a load applied during probing, thereby preventing the occurrence of cracks on the interlayer insulating films 71 and 72. Therefore, it is possible to more positively prevent an electrical short circuit/leakage between a first metal 61 and third metals 91.

Figure 5A:
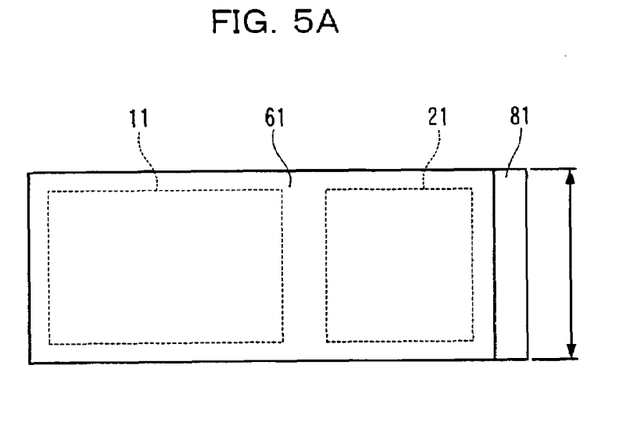
FIG. 5 is a plan view showing each layer of the pad section shown in FIG. 4.
Figure 5B:
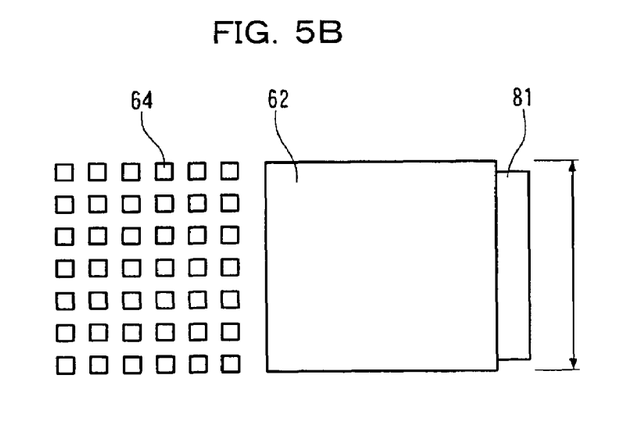
Figure 5C:
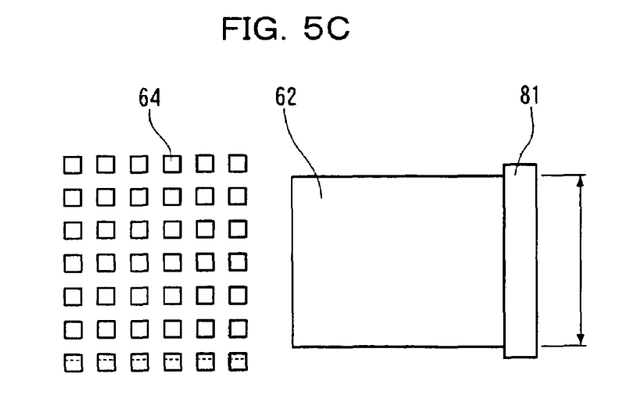

FIG. 5 is a plan view showing each layer of the probe pad 11 and the bonding pad 21. FIG. 5A shows the layer of the first metal 61 and FIGS. 5B and 5C show two examples of the layers of the second metal 62 and the metals 64.

As in FIG. 2, FIG. 5A shows the area of the probe pad 11 and the area of the bonding pad 21 on the first metal 61. The probe pad 11 and the bonding pad 21 are separated by a first protective film 31. A drawing metal 81 has the same width as the pad metal 61.

In FIG. 5B, as is understood from the width of the drawing metal 81, the second metal 62 and the arrangement of the metals 64 are larger in width than the first metal 61.

In FIG. 5C, as is understood from the width of the drawing metal 81, the second metal 62 is smaller in width than the first metal 61.

In both of FIGS. 5B and 5C, an overlap of metal edges 61a and 62b is eliminated, thereby reducing stress during bonding.

Figure 6A:
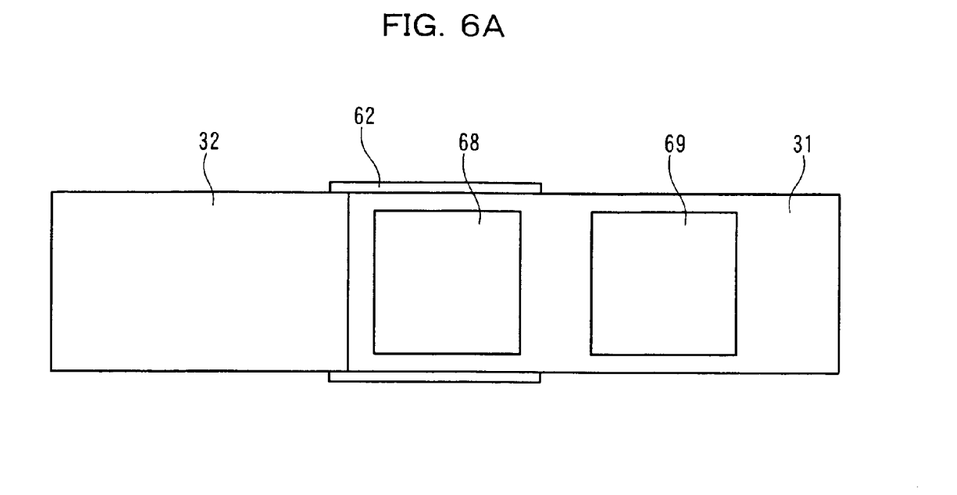
FIGS. 6A and 6B are a plan view and a sectional view showing a configuration of a pad section of a semiconductor device and a part surrounding the pad section according to Embodiment 3 of the present invention.
Figure 6B:
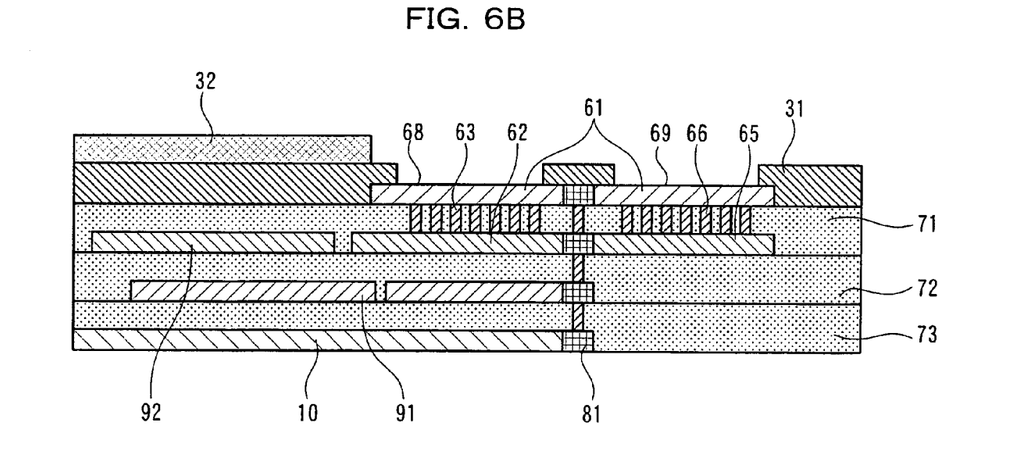

FIG. 6 shows the main configuration of a semiconductor device according to Embodiment 3 of the present invention. FIGS. 6A and 6B are a plan view and a sectional view showing a pad section, which is an electrode for external connection of the semiconductor device, and a part around the pad section.

The semiconductor device of Embodiment 3 is different from that of Embodiment 1 in that an external pad is disposed outside the bonding pad 21 of Embodiment 1, that is, on the side of a scribing area around a chip. In this embodiment, two pads are referred to as an inner pad 68 and an outer pad 69.

Like the bonding pad 21, each of the inner pad 68 and the outer pad 69 has a stacked via pad structure which is constituted of a first metal 61, second metals 62 and 65, and vias 63 and 66 for connecting the metals. Reference numeral 92 denotes a metal formed as, e.g., a second power supply layer for supplying power. The power supply layer is formed together with third metals 91 in the third layer, so that a potential can be further stabilized in a power supply wire.

Figure 7A:
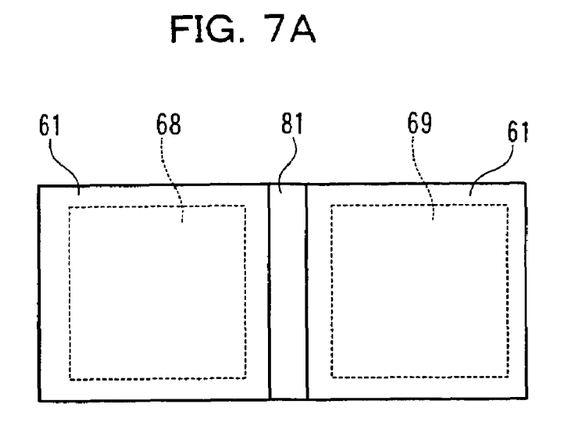
FIG. 7 is a plan view showing each layer of the pad section shown in FIG. 6.
Figure 7B:
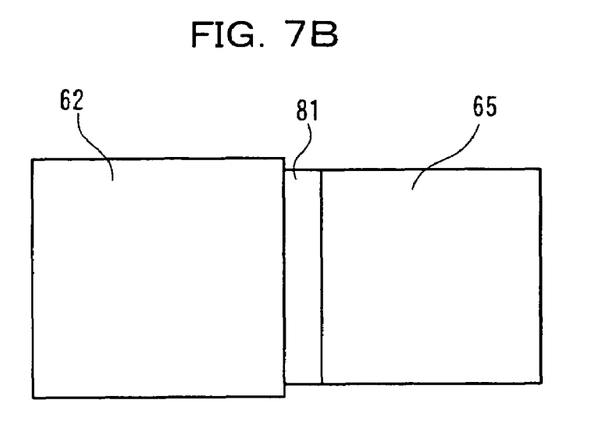
Figure 7C:
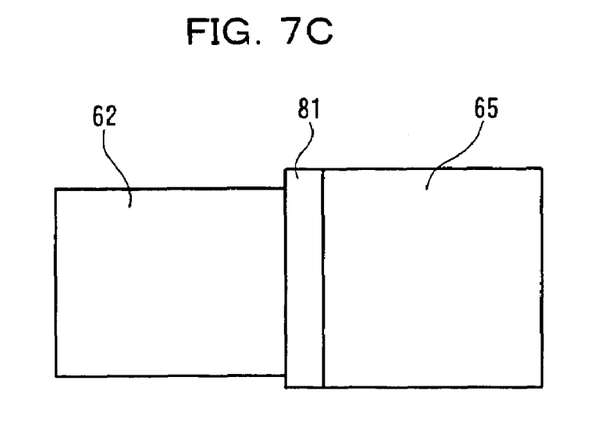

FIG. 7 is a plan view showing each layer of the inner pad 68 and the outer pad 69. FIG. 7A shows the layer of the first metal 61 and FIGS. 7B and 7C show two examples of the layers of the second metals 62 and 65.

As in FIG. 2, FIG. 7A shows the area of the inner pad 68 and the area of the outer pad 69 on the first metal 61. The inner pad 68 and the outer pad 69 are separated by a first protective film 31. A drawing metal 81 has the same width as the pad metal 61.

In FIG. 7B, as is understood from the width of the drawing metal 81, the second metal 62 is larger in width than the first metal 61.

In FIG. 7C, as is understood from the width of the drawing metal 81, the second metal 62 is smaller in width than the first metal 61.

In both of FIGS. 7B and 7C, an overlap of metal edges 61a and 62a is eliminated, thereby reducing stress during bonding.

Figure 8A:
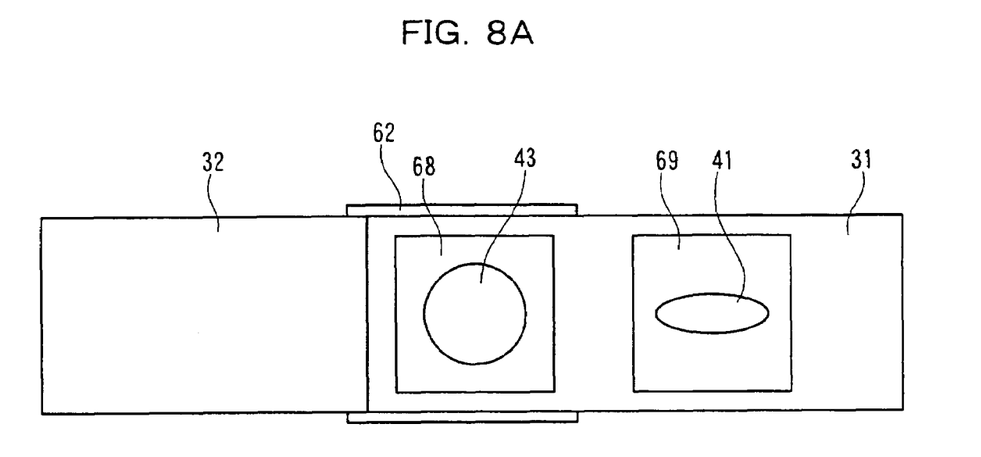
FIGS. 8A and 8B are a plan view and a sectional view showing a state of probing and ball bonding on the pad section shown in FIGS. 6A and 6B.
Figure 8B:
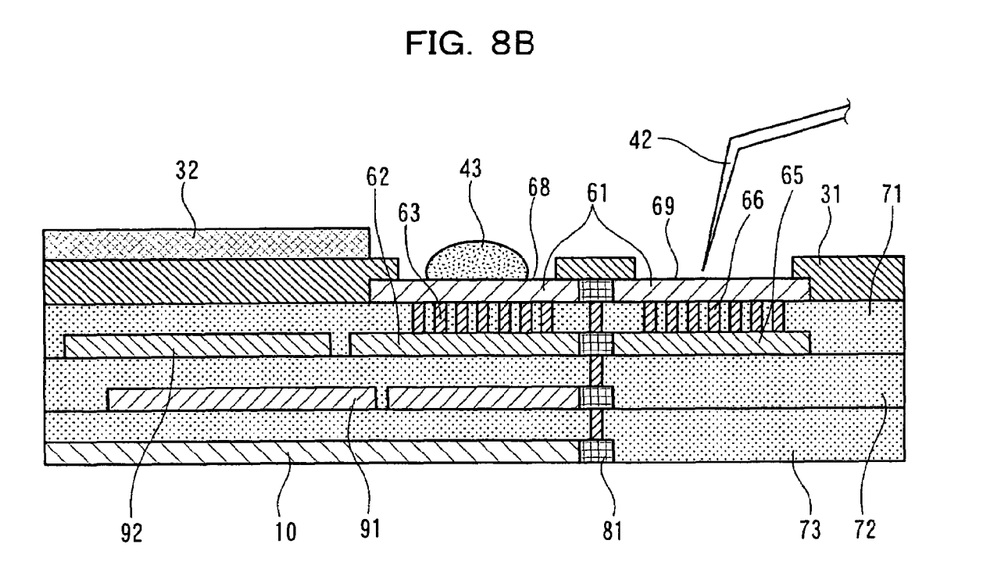

FIG. 8 shows a state around the pad when probing and ball bonding are performed on the semiconductor device according to Embodiment 3 shown in FIG. 6. FIGS. 8A and 8B are a plan view and a sectional view, respectively. Probing is performed on the outer pad 69 by using a probe needle 42. A probe mark 41 appears on the outer pad 69 due to the sliding of the probe needle 42. A metal bump 43 is formed on the inner pad 68.

It is not always necessary to form the inner pad 68 and the outer pad 69 as a single film made of the same metal. The inner pad 68 and the outer pad 69 may be different films made of different metals.

Figure 9:
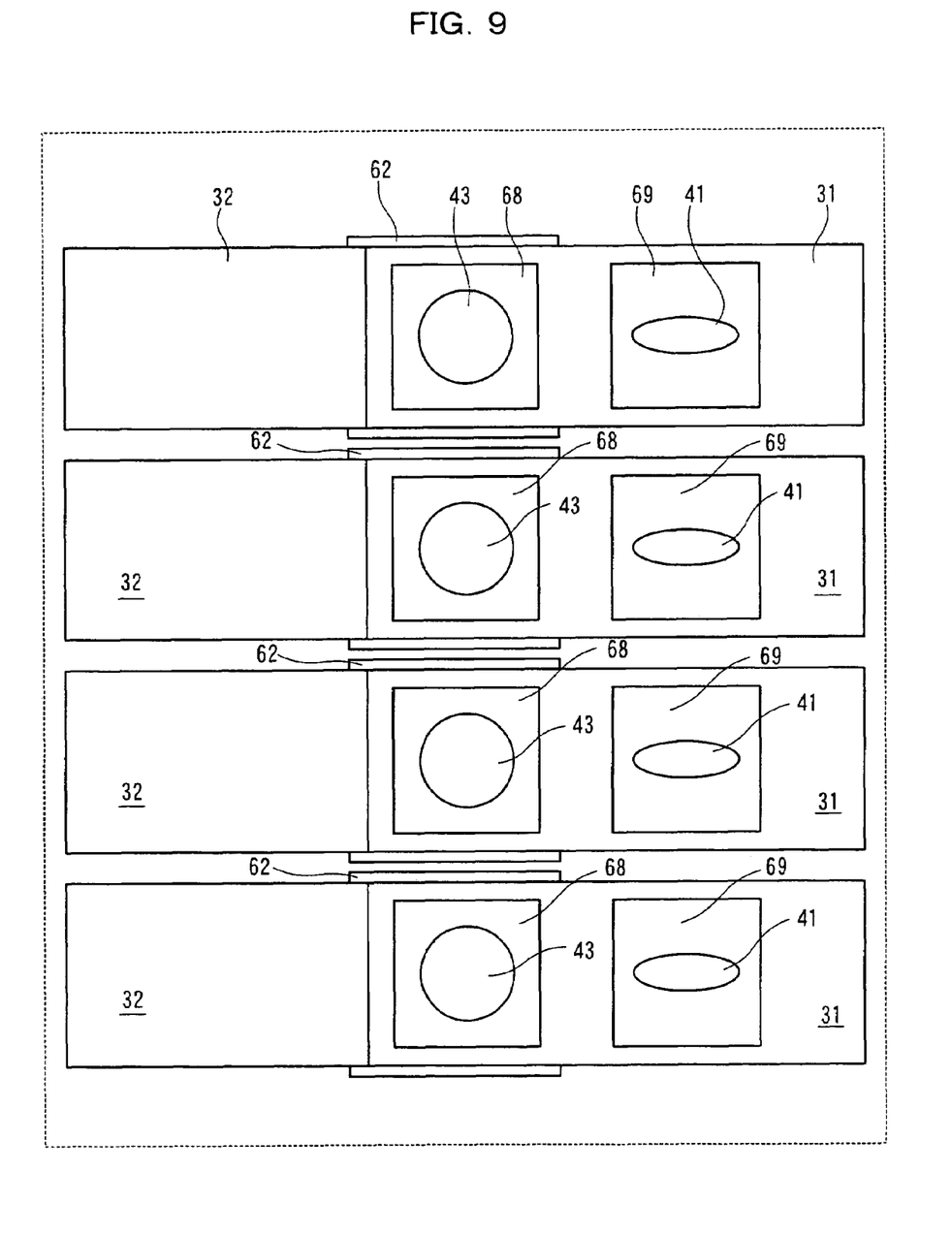
FIG. 9 is a plan view showing that a plurality of pad sections shown in FIGS. 6A and 6B are disposed.

FIG. 9 is a plan view showing that a plurality of pad sections are disposed on an area of an input/output circuit. In each of the plurality of pad sections, the metal bump 43 is provided on the inner pad 68 and the probe mark 41 appears on the outer pad 69.

Figure 10:
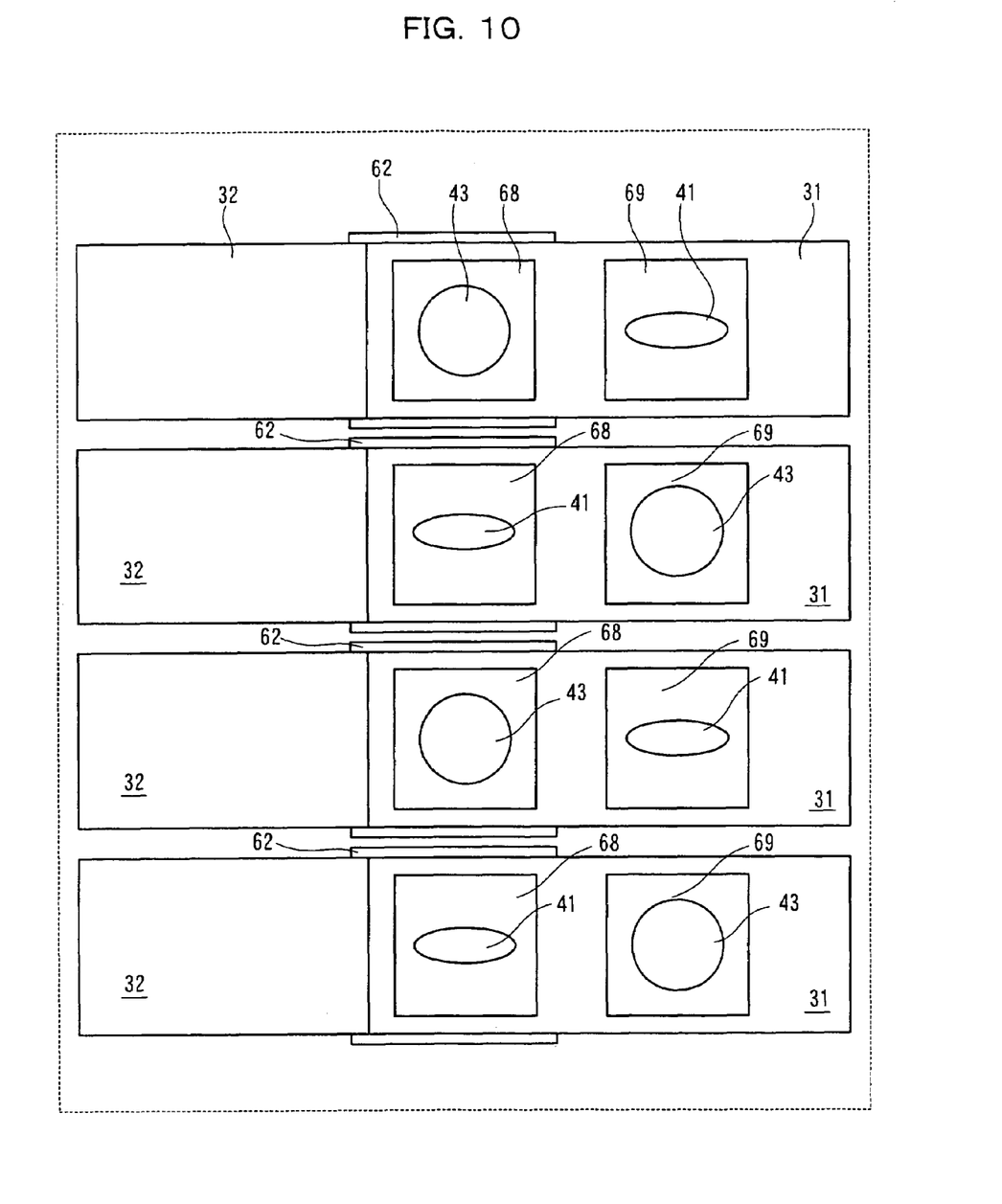
FIG. 10 is another plan view showing that a plurality of pad sections shown in FIGS. 6A and 6B are disposed.

FIG. 10 is another plan view showing that a plurality of pad sections are disposed on an area of the input/output circuit. The metal bumps 43 are alternately disposed on the inner pads 68 and the outer pads 69, and the probe marks 41 appear on the other inner pads 68 and outer pads 69.

In this way, the pads for probing and the pads for bonding (or pad areas) are arranged in a zigzag pattern, so that a pad pitch can be increased in appearance. Further, a pitch for connecting bumps can be increased by providing the plurality of pads in the cell.

Hence, in the case where individual semiconductor devices are flip-chip mounted on a carrier substrate by using the metal bumps 43 to have a surface mount package such as a Chip Size Package (CSP) and a Ball Grid Array (BGA), the carrier substrate can be increased in electrode pitch, rules on substrate design are moderated, the cost of the substrate can be reduced, and other great merits can be obtained.

For example, the metal bump 43 may be formed as a stud bump, which has a gold ball as a base and is shaped like a two-step protrusion, or a metal bump made of a material such as Au, Ni, and Cu by electrolytic plating or electroless plating. In either case, the plurality of pads (or pad areas) formed on the area of the input/output circuit are used in the alternating manner. Thus, it is possible to increase a substantial connection pitch, thereby improving a connection yield and productivity.

As described above, according to the present invention, it is possible to reduce stress on an edge of a pad metal layer during bonding and probing and relax stress applied to an interlayer insulating film under the pad metal layer, thereby reducing damage on the interlayer insulating film under the pad metal layer.

Further, a second pad area for a wafer test is provided separately from a first pad area for bonding, thereby avoiding damage and an indentation caused by probing on the interlayer insulating film.

Also when the pad section is disposed on a circuit element or a area of wiring, a connection can be readily made to the pad section while preventing a bonding load from damaging wiring section or a diffusion section. Therefore, as compared with a pad section disposed in a part other than a circuit element or an area of wiring, the chip size can be reduced at least by the total area of the pad section, thereby reducing the cost of chips.

Hence, the semiconductor device of the present invention is particularly useful as a semiconductor device for performing a wafer test and bonding for external connection on an electrode for external connection.

What is claimed is:

1. A semiconductor device comprising:
    a bonding pad accessible as an electrode for external connection, the bonding pad comprising a first pad metal layer, a second pad metal layer located under the first pad metal layer, an interlayer insulating film located between the first and second pad metal layers, and a via electrically connecting the first pad metal layer and the second pad metal layer, wherein corresponding edges of the first pad metal layer and the second pad metal layer are vertically noncoincident;
    a protective film on the first pad metal layer, the protective film having an opening over the first pad metal layer, thereby making the first pad metal layer accessible as an electrode; and
    a wire connected to the first pad metal layer,
    wherein, an edge of the first metal pad layer and an edge of the second metal pad layer are laterally displaced from each other by at least 1.5 µm.

2. The semiconductor device according to claim 1, wherein in a vertical view, the line of the edge of the second pad metal layer is located outside the line of the edge of the first pad metal layer.

3. The semiconductor device according to claim 1, wherein in a vertical view, the line of the edge of the second pad metal layer is located inside the line of the first pad metal layer.

4. The semiconductor device according to claim 1, further comprising a circuit element or a wire located under the bonding pad.

5. The semiconductor device according to claim 1, wherein, in a vertical view, a gap between a line of an edge of the first pad metal layer and a line of an edge of the second pad metal layer is 2 µm or less in width.

6. A semiconductor device comprising:
    a probe pad;
    a bonding pad accessible as an electrode for external connection the bonding pad comprising a first pad metal layer, a second pad metal layer located under the first pad metal layer, an interlayer insulating film located between the first and second pad metal layers, and a via electrically connecting the first pad metal layer and the second pad metal layer, wherein corresponding edges of the first pad metal layer and the second pad metal layer are vertically noncoincident;
    a protective film on the first pad metal layer, the protective film having an opening over the first pad metal layer, thereby making the first pad metal layer accessible as an electrode; and
    a wire connected to the first pad metal layer,
    wherein, an edge of the first metal pad layer and an edge of the second metal pad layer are laterally displaced from each other by at least 1.5 µm.

7. The semiconductor device according to claim 6, further comprising a plurality of dummy metals located under the probe pad and coplanar with the second pad metal layer.

8. The semiconductor device according to claim 6, further comprising a circuit element or a wire located under at least one of the bonding pad and the probe pad.

9. The semiconductor device according to claim 6, wherein the probe pad comprises the first pad metal layer.

10. The semiconductor device according to claim 6, wherein, in a vertical view, a gap between a line of an edge of the first pad metal layer and a line of an edge of the second pad metal layer is 2 µm or less in width.

* * * * *